United States Patent [19]

Rostoker et al.

[11] Patent Number: 5,696,403

[45] Date of Patent: *Dec. 9, 1997

[54] SYSTEM HAVING INPUT-OUTPUT DRIVE REDUCTION

[75] Inventors: Michael D. Rostoker, Boulder Creek; Nicholas F. Pasch, Pacifica, both of Calif.

[73] Assignee: LSI Logic Corporation, Milpitas, Calif.

[*] Notice: The term of this patent shall not extend beyond the expiration date of Pat. No. 5,517,055.

[21] Appl. No.: 626,468

[22] Filed: Apr. 2, 1996

Related U.S. Application Data

[63] Continuation-in-part of Ser. No. 143,197, Oct. 25, 1993, Pat. No. 5,517,055.

[51] Int. Cl.[6] ............................................. H01L 23/552
[52] U.S. Cl. ........................ 257/659; 257/532; 257/758
[58] Field of Search .......................... 257/734, 659, 257/654, 532, 758, 630, 369

[56] References Cited

U.S. PATENT DOCUMENTS

| | | | |
|---|---|---|---|
| 5,471,093 | 11/1995 | Cheung | 257/758 |
| 5,479,044 | 12/1995 | Narahara et al. | 257/533 |
| 5,504,355 | 4/1996 | Hatano | 257/225 |
| 5,585,664 | 12/1996 | Ito | 257/659 |

Primary Examiner—Sara W. Crane
Assistant Examiner—Douglas Wille
Attorney, Agent, or Firm—Katz & Cotton, LLP

[57] ABSTRACT

An electronic system utilizing at least one integrated circuit that has reduced drive requirements for the input and output pads of the integrated circuit die. The integrated circuit of the system has an intermediate structure added between the output connection pad and substrate to reduce the amount of electron charge required to charge the output pad capacitance of the integrated circuit to a substantially negligible amount. In addition, an intermediate structure may be added between an input connection pad and substrate of the integrated circuit to reduce the amount of electron charge required to charge the input pad capacitance to a substantially negligible amount. In the present invention, a transistor amplifier driver is connected to the intermediate structure between the output pad and substrate to charge the capacitance that exists between the intermediate structure and substrate so that the voltage potential of the intermediate structure is substantially the same value as the output pad voltage value. In similar fashion, a transistor amplifier driver is connected to the intermediate structure between the input pad and substrate to charge the capacitance that exists between the intermediate structure and substrate so that the voltage potential of the intermediate structure is substantially the same value as the input pad voltage value.

24 Claims, 15 Drawing Sheets

SYSTEM HAVING INPUT-OUTPUT DRIVE REDUCTION

CROSS REFERENCE TO RELATED PATENT APPLICATION

This patent application is a continuation-in-part of commonly owned U.S. patent application Ser. No. 08/143,197, filed Oct. 25, 1993, now U.S. Pat. No. 5,517,055 entitled "INPUT-OUTPUT DRIVE REDUCTION IN A SEMICONDUCTOR INTEGRATED," by Nicholas F. Pasch, and is incorporated by reference herein.

BACKGROUND OF THE INVENTION

1. Field of the Invention

The present invention relates generally to electronic systems utilizing semiconductor devices and semiconductor integrated circuits and, more particularly, to an electronic system comprised of at least one semiconductor device and/or integrated circuit having reduced drive requirements for the input and output circuits of the device.

2. Description of the Related Technology

Electronic systems utilizing integrated circuits have revolutionized the way modern society works and lives by making possible a level of technological sophistication unknown in the days of vacuum tubes and even discrete transistors. These electronic systems, which are building blocks for ever larger and more complex systems such as machines used in manufacture, transportation and the like. The sophistication of these electronic systems is the result of the complex functions handled by integrated circuits making up the electronic system. An integrated circuit may comprise, on a small silicon chip, many thousand or even a million or more transistors, including associated diodes, resistors and capacitors, interconnected together to form complex electronic functions. The integrated circuit chip or "die" is packaged in an encapsulating package having leads or "pins" for connecting the integrated circuit functions to the overall electronic system or product incorporating a plurality of integrated circuits.

Semiconductor integrated circuits comprise the majority of electronic circuits in computers and other digital electronic products. Present technology integrated circuits may contain millions of transistors and be configured, for example, as a central processing unit (CPU), arithmetic logic unit (ALU), random access memory (RAM), programmable logic array (PLA), application specific integrated circuit (ASIC), or digital signal processor (DSP). Both sophistication and speed of operation of these integrated circuits has rapidly increased because of improvements in integrated circuit manufacturing technologies resulting in smaller and faster devices.

Semiconductor integrated circuits may be formed on silicon wafer dies by a plurality of layers of different materials. These materials are selected for their conduction, insulation or electron charge characteristics. Transistors may be formed into the silicon die by diffusion means well known to those skilled in the art of fabricating integrated circuit dies.

Layers of insulating oxides may be deposited over selected areas of the integrated circuit die so that conductive layers of polysilicon or metal may be deposited thereon. Various methods of deposition may be utilized such as, for example, chemical vapor deposition (CVD) or other methods well known to those skilled in the art of fabricating integrated circuits. Polysilicon may be used as both a circuit element and a conductor such as, for example, the gate structure in a metal oxide semiconductor field effect transistor (MOSFET). Metal is used for interconnection between various circuit elements and for connection to the integrated circuit connection pads.

Connections from the integrated circuit die are generally made by means of the connection pads. The connection pads are located on the face of the integrated circuit die. Bond wires connect the pads to a lead flame which becomes the pins of the integrated circuit package that connect to the electronic system.

These connection pads on the face of the integrated circuit die may be about 60 to 100 micrometers on a side and may be substantially square. The connection pad is mostly parallel with the face of the die and the pad may have a thickness of about from 0.7 to 1 micrometer. Generally, there are one or more insulating layers between the metal connection pad and the surface of the silicon wafer die or "substrate" face. There may also be one or more additional layers of metal and/or polysilicon between the substrate and the connection pad.

The connection pad surface and substrate form a capacitor wherein the pad is the positively charged plate at a logic high level, typically $V_{dd}$, the substrate is the negatively charged plate at $V_{ss}$, and intervening insulation therebetween is the dielectric. Typically, capacitance associated with a connection pad is about 0.5 to 1 picofarad (pF). The pad capacitance is added to the capacitance of the integrated circuit package and electronic system circuit board. The package and system circuit capacitance may be about 5 pF per connection. Thus, the connection pad adds a significant amount of capacitance to the overall system capacitance per connection.

Any circuit capacitance must be charged when going from a low to high logic state, and discharged when going from a high to low logic state. Charging of the circuit capacitance is performed by an output driver circuit such as, for example, a complementary metal oxide semiconductor (CMOS) transistor amplifier. A CMOS output driver, however, must be designed with electrostatic discharge (ESD) protection in mind. The design rules for CMOS ESD protection restrict the CMOS driver performance, including the current drive capability needed to charge and discharge output circuit capacitance.

Inputs to the integrated circuit die also utilize connection pads similar to the output pads described above. When an input is connected to an output, the input capacitance adds to the overall circuit connection capacitance. Input capacitance may be about 0.5 to 1 pF. This amount of input capacitance is significant and represents the majority of the connected capacitance, especially when multiple integrated circuit dice are connected in a hybrid package utilizing close coupled wire bonding therebetween.

Since CMOS transistor amplifier capacitive drive capabilities are limited because of ESD design constraints, what is needed is a way of reducing the output capacitance charge requirements, and, preferably, the input capacitance charge requirements caused by the connection pad capacitance of the integrated circuit die. By reducing overall connection capacitance charging requirements, smaller driver transistors may be utilized in the output amplifiers of the integrated circuit. Use of small transistors results in a smaller integrated circuit die or the capability of having more transistor functions on a given die size. This would enable more complex electronic systems that operate faster and with lower power requirements.

OBJECTS OF THE INVENTION

It is, therefore, an object of the present invention to provide an electronic system utilizing at least one integrated circuit having an intermediate structure added between the output connection pad and substrate to reduce the amount of electron charge required to charge the output pad capacitance to a substantially negligible amount.

Another object is to provide an electronic system utilizing at least one integrated circuit having an intermediate structure added between an input connection pad and substrate to reduce the amount of electron charge required to charge the input pad capacitance to a substantially negligible amount.

A further object of the present invention is to connect a transistor amplifier driver to the intermediate structure between the output pad and substrate to charge the capacitance that exists between the intermediate structure and substrate so that the voltage potential of the intermediate structure is substantially the same value as the output pad voltage value.

Still a further object is to connect a transistor amplifier driver to the intermediate structure between the input pad and substrate to charge the capacitance that exists between the intermediate structure and substrate so that the voltage potential of the intermediate structure is substantially the same value as the input pad voltage value.

Yet another object is to closely couple a plurality of integrated circuit dice in a system together so as to substantially reduce external capacitive loading therebetween.

Still a further object of the present invention is to reduce the size of driver transistors so as to increase the transistor density on an integrated circuit die.

SUMMARY OF THE INVENTION

The above and other objects of the present invention are satisfied, at least in part, by providing an electronic system utilizing at least one integrated circuit having a plurality of input and output connection pads and a plurality of intermediate structure plates between the respective plurality of input and output connection pads and the integrated circuit die substrate. The capacitance of each of the intermediate structure plates may be charged by internal driver stages that are specifically tailored for that purpose.

The amount of electron charge required to charge a capacitor of value C is given by the following formula:

$$Q=CV \qquad (1),$$

where Q is the electron charge in coulombs required, C is the capacitance in farads, and V is the voltage potential in volts. Formula (1) illustrates that the larger the value of V, the larger the value of Q needed to charge the capacitor C to the voltage value V. Thus, if V is small, so will the electron charging requirements for the value Q.

The energy stored in a capacitor is also a function of potential and capacitance. The energy required to charge a capacitor of value C, or the energy stored in the capacitor is given by the formula:

$$W=V^2C/2 \qquad (2),$$

where W is the energy in joules (watt-seconds), and V and C are as described above for formula (1).

Capacitance, C, of either the intermediate plate and substrate or the integrated circuit connection pad and intermediate plate, may be determined by the formula:

$$C=0.224 \, KA/d \qquad (3),$$

where C is capacitance in picofarads, K is the dielectric constant of the material between the plates, A is the area of one side of one plate in square inches, and d is the separation of the plate surfaces in inches.

By charging the capacitance of the intermediate structure when going from a low to a high logic level, the voltage potential difference between the output connection pad and intermediate structure is substantially negligible. The charge or quantity of electricity that can be held in the electric field between the capacitor plates is proportional to the voltage therebetween. The energy required to charge the capacitor is proportional to the square of the voltage between the capacitor plates. Thus, if the voltage difference between the intermediate structure and the integrated circuit connection pad is minimal, so will be the amount of charge or energy needed to overcome the pad capacitance.

The intermediate structure, in effect, acts as a voltage "shadow" that tracks the voltage level change of the connection pad. The present invention transfers the burden of charging the intermediate structure plate capacitance to a stage prior to, or separate from, the output connection pad driver, and which is not constrained or compromised by the requirements for ESD protection. This is so because the intermediate structure output driver is not required to connect to any external circuitry, thus, ESD protection is not a factor.

The present invention may use, for example, a plate as the intermediate structure and this plate may have similar dimensions as the output connection pad. The plate may be connected to a driver stage such as, for example, a non-inverting CMOS transistor amplifier driver that is optimized to drive the capacitance formed by the plate and integrated circuit substrate. The plate driver only sees the plate capacitance and not the external circuit capacitance that the connection pad driver must deal with, along with being constrained by ESD protection requirements.

In addition to the plate driver being optimized for the plate capacitive load, the plate driver may preferably begin charging the intermediate plate capacitance slightly before the output driver charges the output pad capacitance. This precharging of the plate capacitance allows the intermediate plate driver stage to be of modest output power because the plate does not have to reach the logic level voltage at exactly the same time as does the output pad.

Clearly, the present invention reduces the electron charge requirements for the output pad capacitance, and lessens the power requirements of the output driver because less electron charge is required for charging the capacitance connected to the output pad. Preferably, the present invention may also reduce input electron charge requirements by utilizing an intermediate structure or plate similar to the output plate described above. An integrated circuit connection pad is also used for input signals and suffers from the same capacitive effects with the integrated circuit substrate.

The present invention accomplishes the reduction of the input pad capacitance charging requirements by utilizing an input intermediate structure or plate between the input pad and substrate. The input plate may be metal or polysilicon. A non-inverting driver is utilized to charge the input plate. The output of the driver is connected to the input plate and the input of the driver is connected to the input connection pad. There is a propagation delay of one transistor amplifier gate delay time before the input plate may begin charging. However, if the gate propagation delay is small in comparison to the signal input rise time, than the electron energy required to charge the input connection pad is similarly small. Thus, this post input signal charging of the input plate capacitance effectively reduces the input connection pad capacitance charge requirement to a substantially low value.

Utilizing the above described input and output connection pad capacitance charging reduction structures in conjunction with close connected integrated circuit dice, as would be used in a hybrid integrated circuit of an electronic system, enables the integrated circuit transistors to be designed with a smaller structure. The smaller structure results from not requiting excess capacitive charge drive capability in the output transistors. Smaller drive transistors result in more transistor circuits per integrated circuit die.

A feature of the present invention is utilization of an intermediate structure between an integrated circuit connection pad and the integrated circuit substrate.

Another feature is utilizing a separate charging amplifier connected to the intermediate structure for charging the capacitance thereof.

A further feature is precharging the intermediate structure capacitance slightly before the start of charging the output connection pad capacitance.

Yet a further feature is post charging the intermediate structure capacitance slightly after the start of charging the input connection pad capacitance.

An advantage of the present invention is a reduction in the size of transistors used as amplifier drivers for charging connection pad capacitance.

A further advantage is improved speed of operation with the same size and charging capacity transistor amplifier drivers.

It is contemplated that the present invention may utilize system level products comprising single chip modules (SCM) often including other electrical components (such as capacitors, resistors, inductors, etc.); multi-chip modules (MCM) having at least two integrated circuit dice in the same or separate ceramic, resin, or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX, telephone switching, voice mail, auto attendant, network controllers, video teleconferencing, digital data transmission (such as token ring, ethernet, ATM, or the like), and including subsystems or subassemblies for inclusion or attachment to more complex system level products.

Other and further objects, features and advantages will be apparent from the following description of a presently preferred embodiment of the invention, given for the purpose of disclosure and taken in conjunction with the accompanying drawings.

DETAILED DESCRIPTION OF THE PREFERRED EMBODIMENTS

Figure 1:
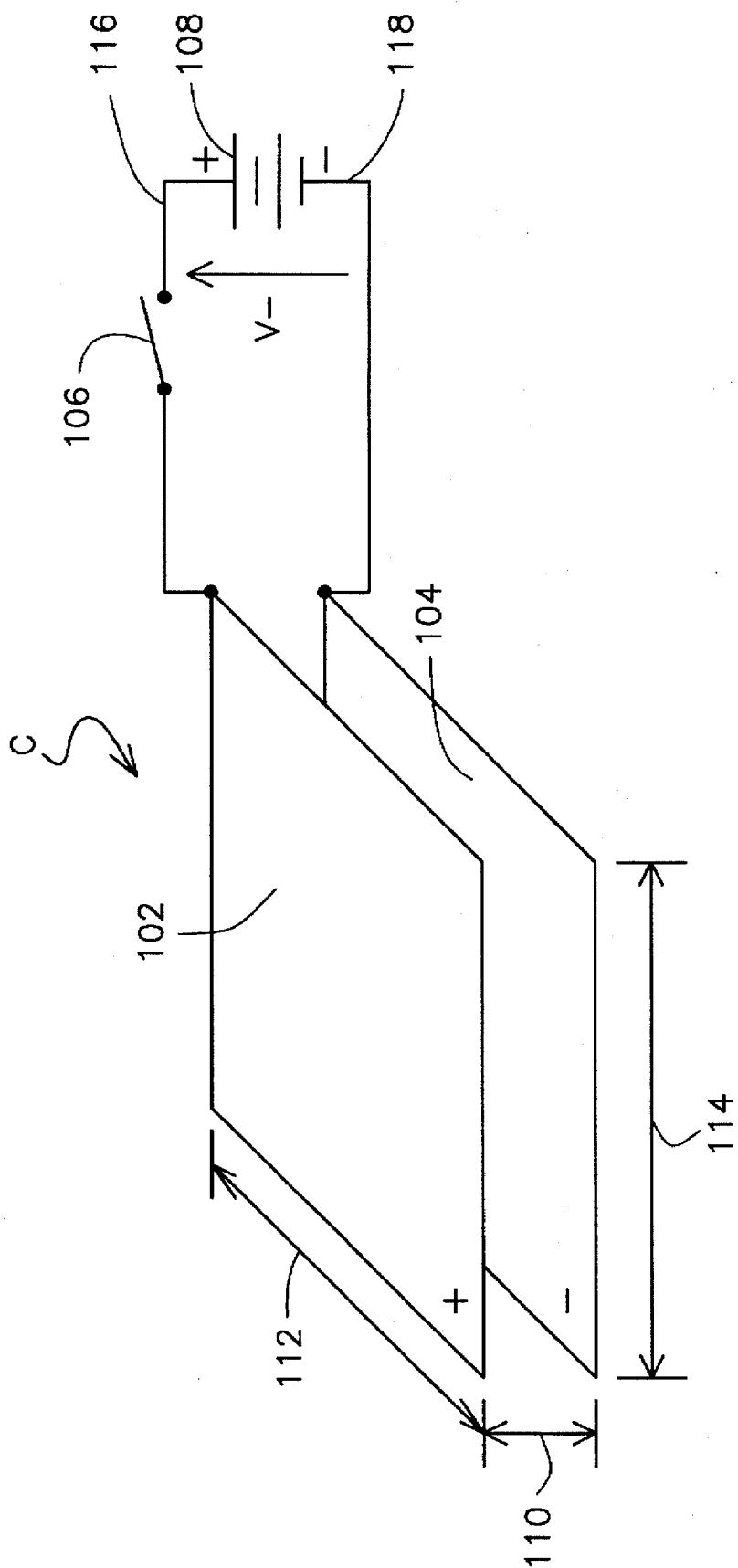
FIG. 1 is a schematic isometric view of a capacitor structure and electrical connections to a voltage source.

The present invention is an electronic system utilizing at least one semiconductor integrated circuit wherein the capacitive charging requirements for both input and output connection pads on the integrated circuit die are reduced. Referring now to the drawings, the details of preferred embodiments are schematically illustrated. Like elements in the drawings will be represented by like numbers, and similar elements will be represented by like numbers with a different lower case letter suffix. The present invention provides a structure and charging means within the integrated circuit die that substantially transfers the capacitive charging requirements normally associated with an integrated circuit connection pad to an intermediate structure located between the connection pad and the integrated circuit substrate.

Referring now to FIG. 1, a schematic of a capacitor is illustrated in isometric view along with schematic connections to a charging voltage source. A capacitor C may be formed by at least two flat metal plates 102 and 104 placed close to each other but not touching. When switch 106 is closed, a voltage potential V from the voltage source (battery) 108 causes electrons to be attracted from the plate 102 to the positive terminal 116 of the battery 108. The same number of electrons are repelled onto the plate 104 from the battery 108 negative terminal 118. Ultimately, there is a voltage potential V between the plates 102 and 104 supplied from the battery 108.

The electron quantity difference between the plates 102 and 104 creates a charge or quantity of electricity that is held in an electric field between the capacitor plates 102 and 104, and is proportional to the applied voltage V and the capacitance value of the capacitor. The formula for the charge or quantity of electricity held in the capacitor C is:

$$Q=CV \tag{1}$$

where Q is charge in coulombs, C is capacitance in farads, and V is potential in volts.

The energy required to charge the capacitor or that is ultimately stored in the capacitor is also a function of voltage potential and capacitance as follows:

$$W=V^2C/2 \tag{2}$$

where W is energy in joules (watt-seconds), V is voltage potential, and C is capacitance in farads. The mount of charge, and the mount of energy required to charge a given value of capacitance is dependent on the voltage or the square of the voltage, respectively. Thus, by reducing the voltage potential between the plates 102 and 104, the amount of charge and energy required to fully charge the capacitor C is reduced.

Capacitance is a function of the geometrical area of the plates 102 and 104, the spacing 110 between the plates, and the dielectric constant of insulating material between the plates. The formula for determining the capacitance of a structure such as the capacitor C of FIG. 1 is as follows:

$$C=0.224 \text{ KA}/d \tag{3}$$

where C is the capacitance in picofarads, K is the dielectric constant of the material between the plates 102 and 104, A is the area of one side of one plate in square inches represented by length 112 times width 114, and d is the separation 110 of the plate surfaces in inches. If one plate is of smaller area than the other plate, then use the area of the smaller plate.

Figure 2:
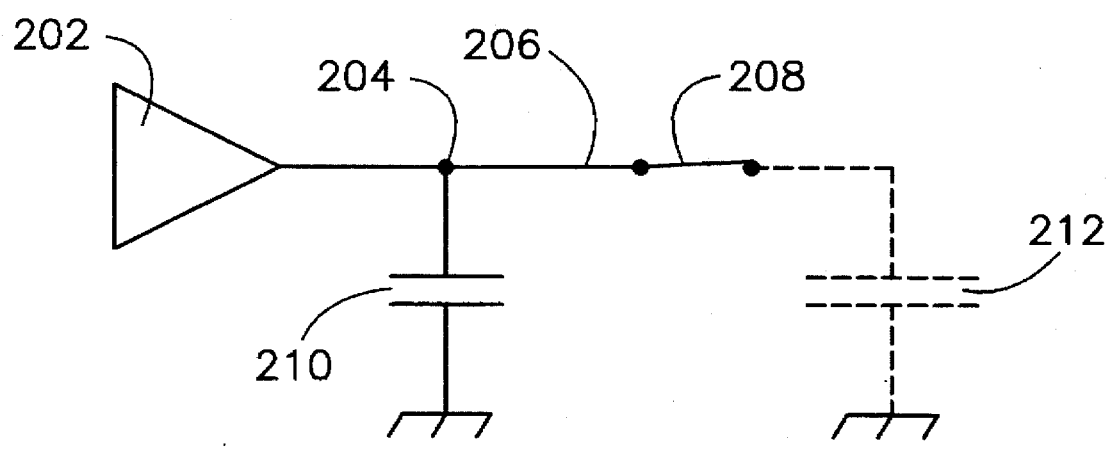
FIG. 2 is a schematic block diagram of an output driver and associated connection pad capacitance and connection capacitance.

Referring now to FIG. 2, a schematic block diagram of an output driver and associated connection pad and external capacitance is illustrated. The integrated circuit die comprises a plurality of transistors where some may be connected to the integrated circuit die as output amplifiers for driving external loads. One typical amplifier is a complementary metal oxide semiconductor (CMOS) amplifier 202 whose output is connected to an integrated circuit die connection pad 204 which connects by means of a bond wire 206 to a lead flame 208. The lead frame 208 connects to the external electronic system circuits.

The connection pad 204 typically is a square planar metal plate in parallel with the substrate of the integrated circuit die and forms a capacitor 210. The pad 204 may be, for example, 60 to 100 micrometers on a side and substantially square. The capacitance of the pad 204 may be, for example, 0.5 to 1 pF. The lead flame 208 connects to the external circuits which may have a capacitance 212 of about 5 pF.

Figure 3A:
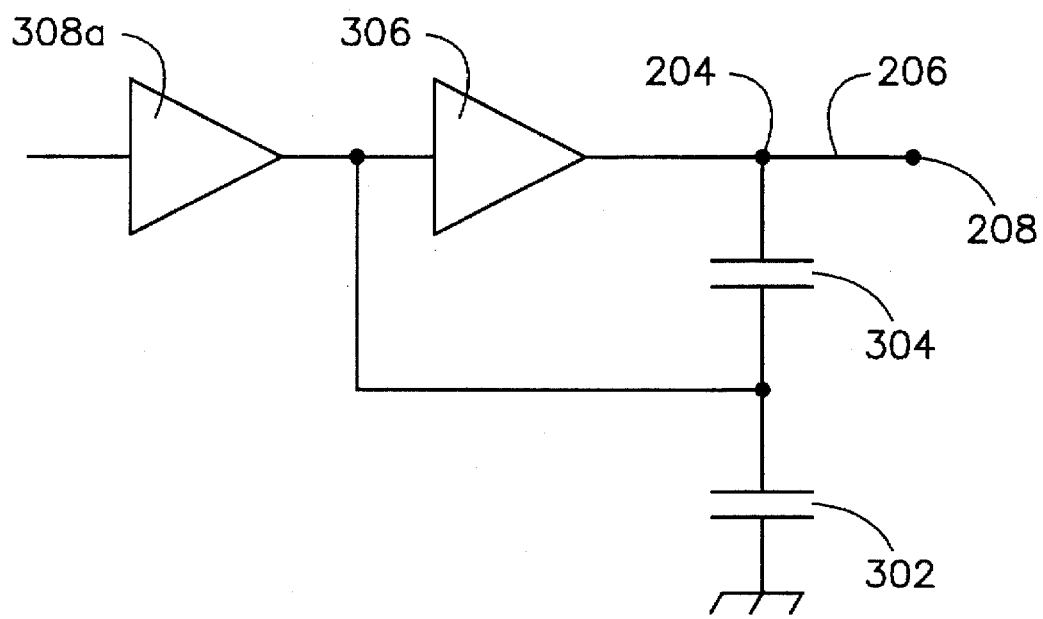
FIGS. 3a and 3b are electrical schematic block diagrams of preferred embodiments of the output capacitance reduction circuits of the present invention.
Figure 3B:
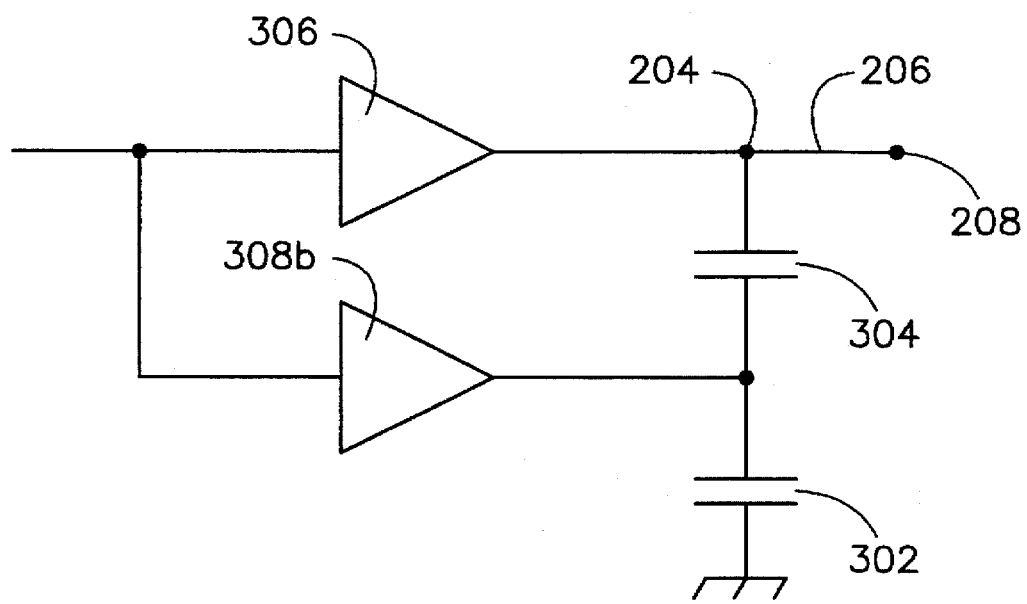
Figure 6:
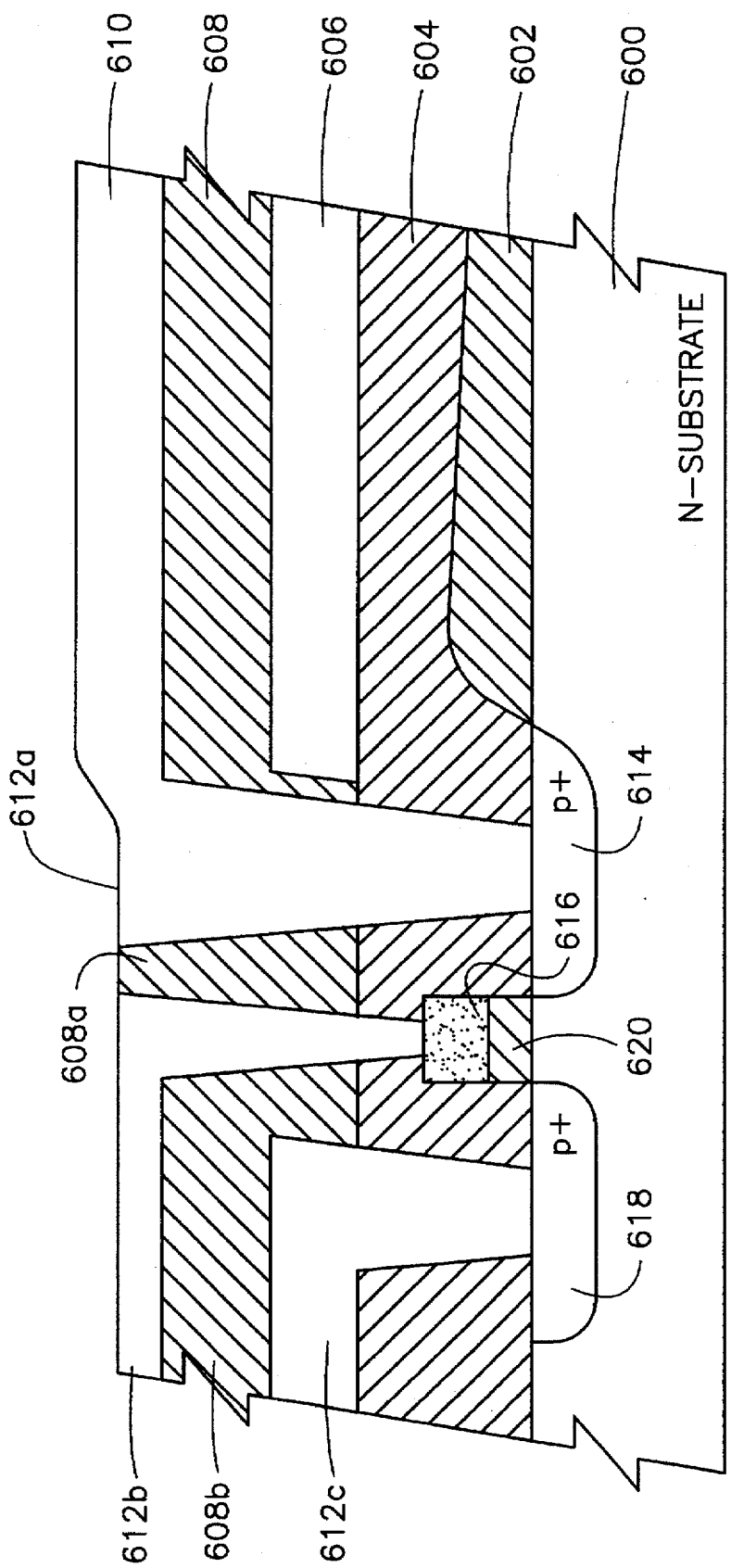
FIG. 6 is a schematic elevational view of a preferred embodiment of the structure of the integrated circuit of the present invention.

Referring now to FIGS. 3a, 3b, and 6, preferred embodiments of the present invention are illustrated in schematic block diagram and elevational views. An intermediate planar conductive structure 606 (FIG. 6) and the integrated circuit substrate 600 forms a capacitor 302 in series with capacitor 304 now formed by the connection pad 610 and the intermediate planar conductive structure 606.

Amplifier 306 drives the pad capacitance 304 and the external load capacitance (not illustrated). Amplifier 308a or 308b drives the capacitor 302. The output of amplifier 308a or 308b charges the capacitor 302 to substantially the same voltage potential as does amplifier 306 charge capacitor 304. Thus, the voltage potential on either plate of the capacitor 304 is substantially the same. Therefore, the amplifier 306 need not supply much, if any, energy to charge the capacitor 304.

The amplifier 308a or 308b now supplies the necessary energy to charge capacitor 302. Amplifier 308a may be connected before and drive amplifier 306, or amplifier 308b input, may be connected in parallel with the input of amplifier 306. An advantage of the amplifier 308a is that it may precharge the capacitor 302 which may allow smaller transistors to be utilized in the circuit of the amplifier 308a. On the other hand, amplifier 308b may track the signal output rise time of amplifier 306 more closely.

Utilizing either of the circuits of FIGS. 3a or 3b results in a reduction of drive required from the output amplifier 306. In the present invention, reduced drive requirements of the amplifier 306 allow reduction in the amplifier transistor size. Smaller transistors enable more transistors on a given integrated circuit die size.

Figure 4:
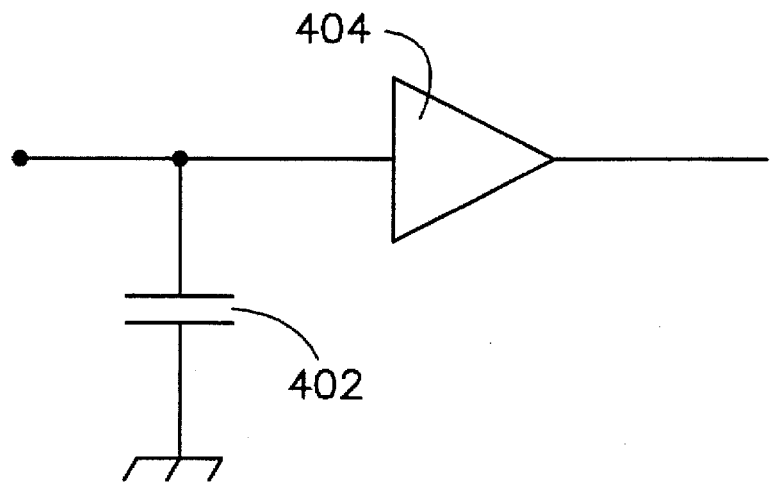
FIG. 4 is a schematic block diagram of an input circuit and associated connection pad capacitance.
Figure 5:
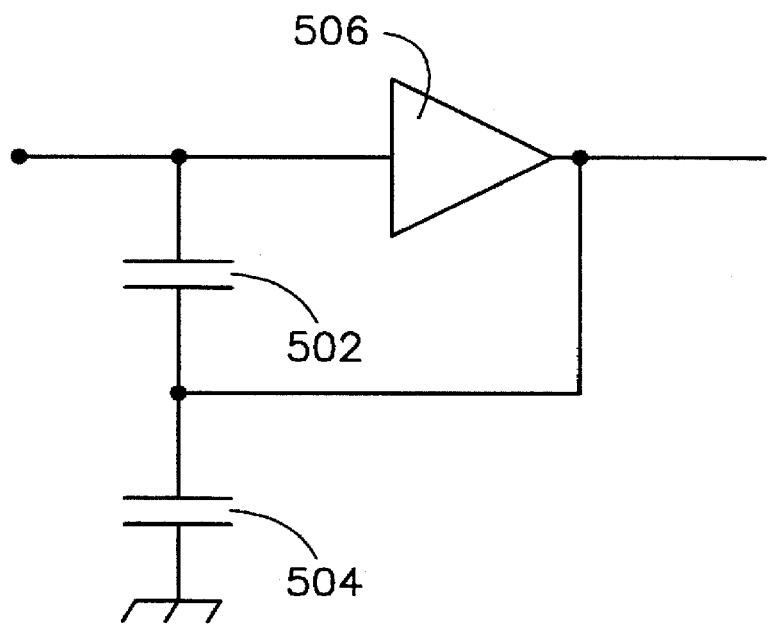
FIG. 5 is a schematic block diagram of a preferred embodiment of the input capacitance reduction circuit of the present invention for an input circuit.

Referring now to FIGS. 4 and 5, schematic block diagrams illustrating input capacitance, and the circuits for reducing input capacitance charging, are illustrated, respectively. Input capacitance 402 results from an input pad consisting of a planar metal pad in parallel with the integrated circuit die substrate. This input capacitance 402 is similar to the output capacitance 210 (FIG. 2) described above.

An intermediate planar conductive structure 606 (FIG. 6) may be located between the input pad and the integrated circuit die substrate 600 in similar fashion to the output circuit embodiment described above. The difference, however, between the output embodiment and the input charge reduction embodiment illustrated in FIG. 5, is that a capacitor 504, formed from the intermediate planar conductive structure 606 and the integrated circuit die substrate 600, cannot be charged to a voltage value substantially the same as the voltage on capacitor 502 until the propagation delay time of amplifier 506.

Charging of the capacitor 504 by amplifier 506 may be delayed by about less than 100 picoseconds. Therefore, if the rise time of the input signal is longer than the propagation delay time of the amplifier 506, then the amplifier 506 will charge the capacitor 504 substantially at the same time as does the input charge capacitor 502. Thus, the amount of charge or energy necessary to charge the input capacitor 502 becomes negligible.

Fabrication of integrated circuits is well known to those skilled in the art, and exact details of a particular way of fabricating integrated circuits is not the intent of this disclosure. One skilled in the art of fabricating integrated circuits will readily appreciate the novelty and usefulness of the present invention disclosed herein.

Referring now to FIG. 6, a schematic elevational view of a preferred embodiment of the structure of an integrated circuit used in the present invention is illustrated. An integrated circuit die comprises a substrate 600 over which a field oxide layer 602 is applied by chemical vapor deposition (CVD) or by other means well known in the art. Transistor elements such as a source and drain may be formed in doped wells in the substrate 600 such as, for example, p-wells 614 and 618, respectively. A gate element 616 may be formed over a thin oxide layer 620. This combination of transistor elements forms a PMOS transistor. An NMOS transistor may be similarly formed with negative doped wells.

Over the field oxide layer 602 and transistor elements 614, 616 and 618, a thick oxide layer 604 may be deposited by CVD or other means well known in the art. The thick oxide layer 604 may be used to insulate the transistor elements from the next layer of, for example, metal connections. Above the thick oxide layer 604, an intermediate planar conductive structure 606 may be deposited thereon. The intermediate planar conductive structure 606 forms one plate of a capacitor (i.e., capacitor 302, FIG. 3a) and the substrate 600 forms the other plate. The intermediate planar conductive structure 606 may be metal or polysilicon, or any other conductive means utilized in the fabrication of the integrated circuit. Transistor element 614 and connection pad 610 may be connected together by conductor 612a. The gate element 616 may be connected to by conductor 612b, and transistor element 618 may be connected to by conductor 612c.

Another layer of insulating oxide 608 may be deposited over the intermediate planar conductive structure 606 and then the output connection pad 610 deposited over the insulating oxide layer 608. The capacitor 304 of FIG. 3a is formed by the combination of intermediate planar conductive structure 606 and connection pad 610. The voltage on the intermediate planar conductive structure 606, however, tracks the voltage on the output connection pad 610; therefore, the voltage potential difference therebetween is minimal. Minimal voltage difference requires minimal charging energy from an output driver. In this way the present invention reduces the amount of charging energy required from an output amplifier. In similar fashion, a corresponding input charging energy reduction may be obtained by utilizing the embodiment illustrated in FIG. 5.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alas;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 7:
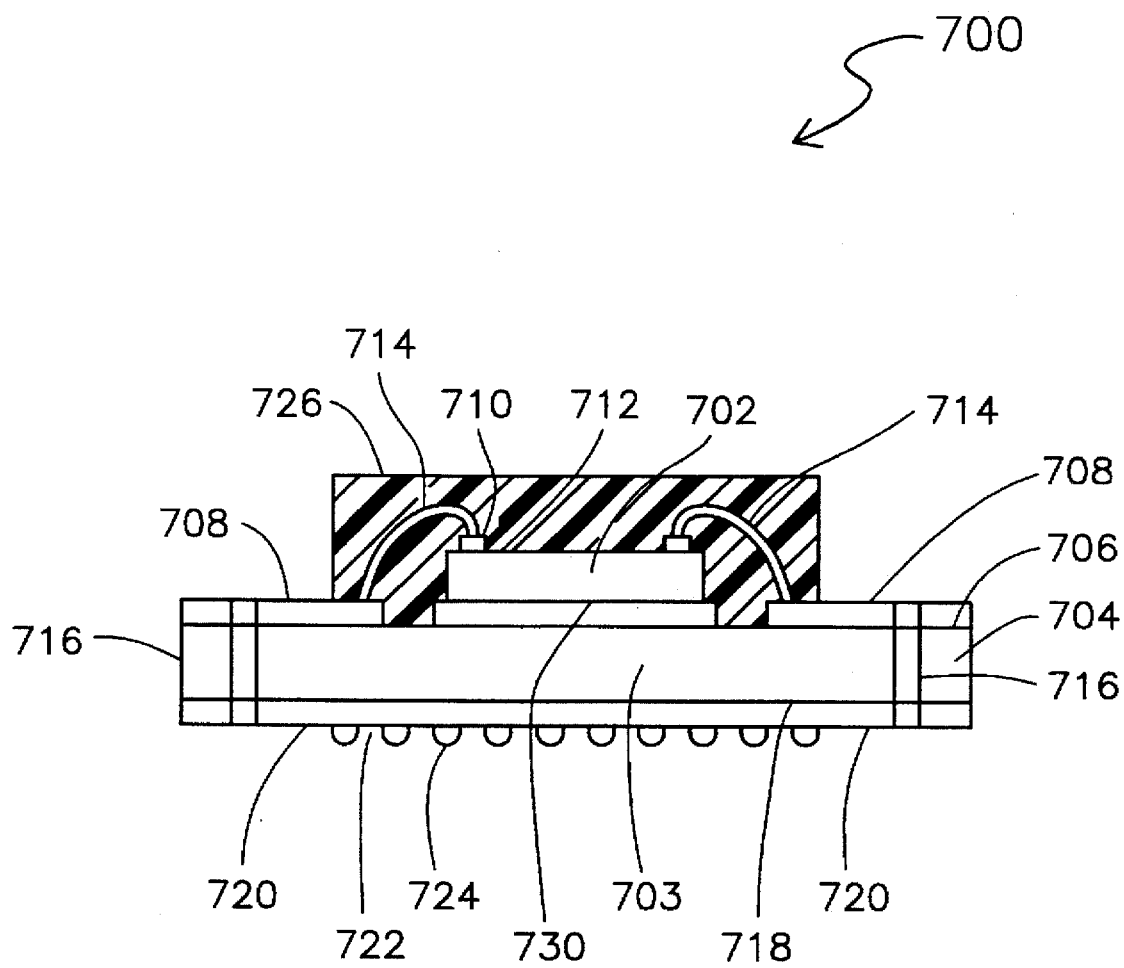
FIG. 7 is a schematic elevational view of a single chip module illustrated in cross section.

Referring to FIG. 7, a schematic elevational view of a SCM is illustrated in cross section. The SCM 700, as illustrated, is a ball bump grid array semiconductor package. A semiconductor die 702 is mounted to the top surface of a central area 703 of a substrate 704. The semiconductor die has conductive lines 712 formed thereon (not illustrated). The top surface 706 of the substrate 704 is provided with a number of conductive traces 708 that extend from near the periphery of the substrate 704 to the central area 703. The die 702 has bond pads 710 thereon. Bond wires 714 extend from the bond pads 710 to inner ends of the traces 708. Near the periphery of the substrate 704, there are plated (conductive) through-holes (vias) 716 extending from the bottom surface 718 of the substrate 704, through the substrate to a respective trace 708. The bottom surface 718 of the substrate is provided with a number of conductive traces 720, each having an end connected with a respective via 716. In this manner, signals (and power) to and from the die are connected through the bond wires 714, through the top side traces 708, through the vias 716, to the bottom side traces 720. Solder balls 724 are attached to the traces 720. A package body 726 is formed over the die 702, and partially covers the top surface of the substrate 704.

Pin grid array semiconductor packages, chip carders (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 704 of FIG. 7) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 8:
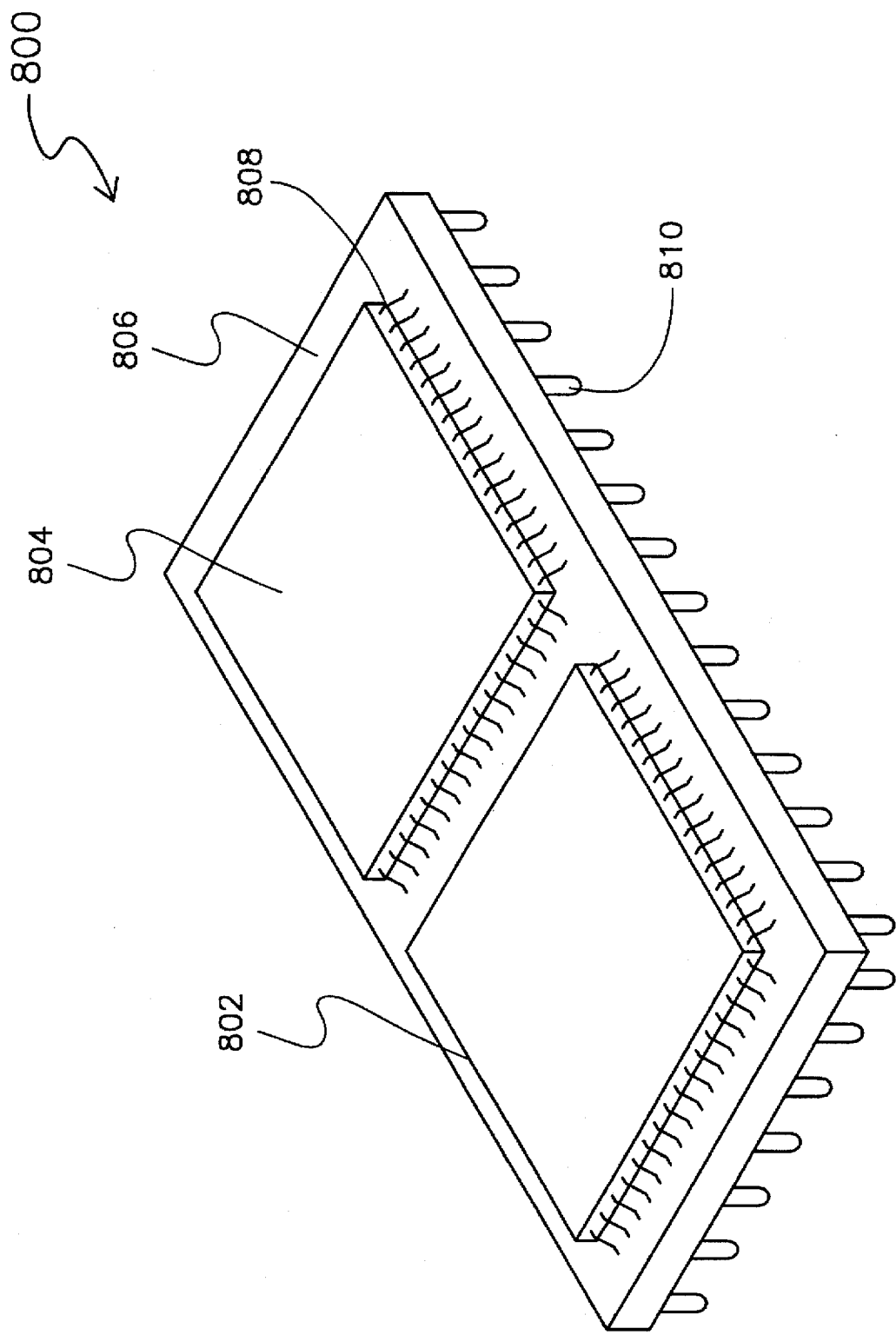
FIG. 8 is a schematic perspective view of a multi-chip module.

FIG. 8 illustrates a schematic perspective view of a MCM. MCM 800 comprises a substrate 806 having conductive lines formed thereon (not illustrated), at least two semiconductor dies 802 and 804 disposed on the substrate 806 and electrically connected to conductive lines (not illustrated) of the substrate 806 by the outer tips of lead time leads 808. The dies 802 and 804 may be physically mounted to the substrate 806. The two semiconductor dies 802 and 804 are illustrated encapsulated, however, non-encapsulated flip-chip ball bump dies are also contemplated. One or more layers of conductive traces and plated through-holes (not illustrated) may be disposed within substrate 806 and are used to connect the semiconductor dies 802 and 804 to one another and to external connections 810, such as the solder ball bump structures as described above. Additional electrical components, such as capacitors, resistors and inductors (not illustrated) may also be disposed on and connected to the substrate 806. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 9:
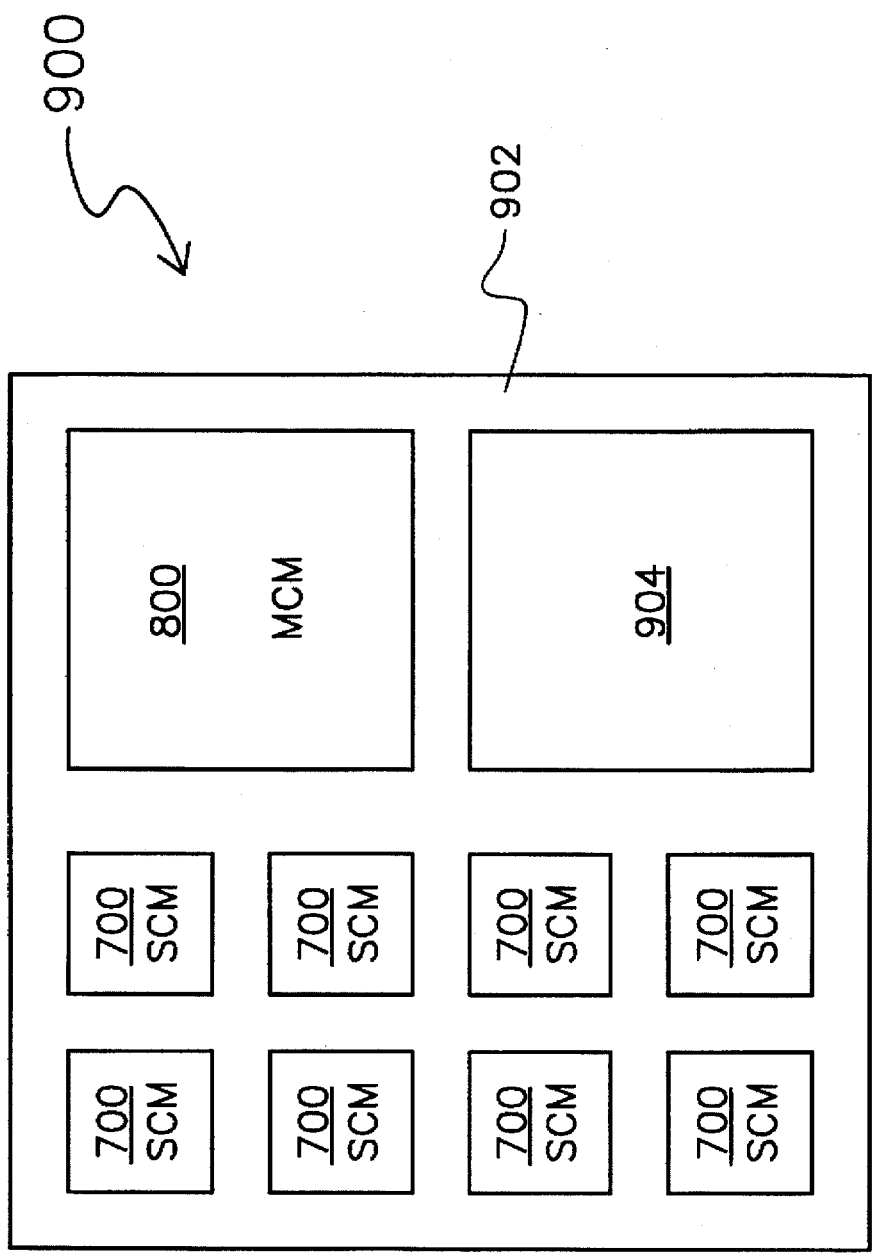
FIG. 9 is a schematic top view of a board level product.

FIG. 9 illustrates a schematic top view of a board level product (BLP). The BLP 900 comprises an array of SCMs 700, a MCM 800, and a memory component 804. The SCMs 700, the MCM 800, and memory 904 are each disposed on and connected to a printed wiring board 902. The printed wiring board 902 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 10:
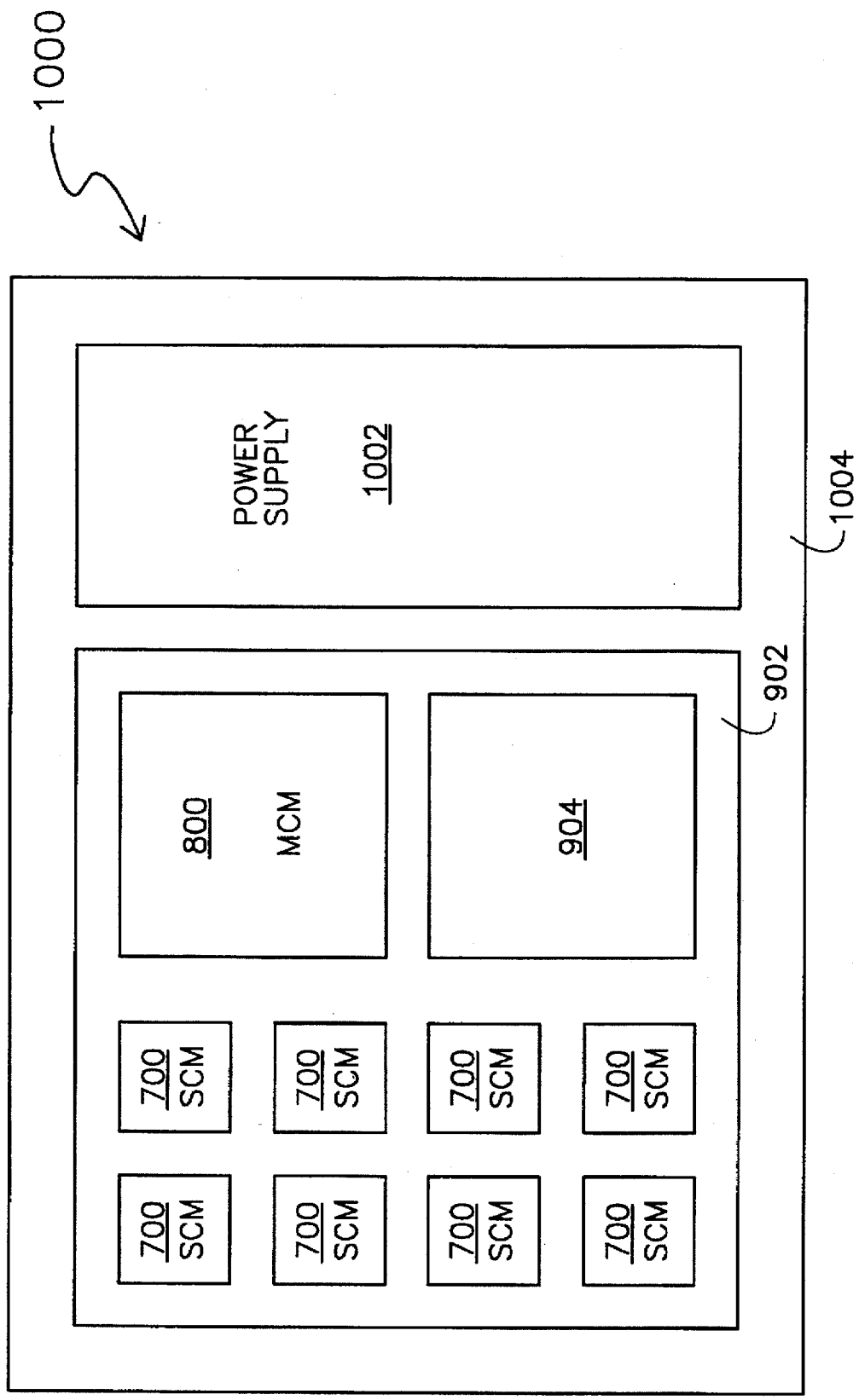
FIG. 10 is a schematic top view of a box level product.

FIG. 10 illustrates a schematic top view of a box level product. The box level product 1000 comprises at least one printed wiring board 902 as described above, a power supply 1002 and an enclosure or box 1004 containing the at least one board 902 and the power supply 1002. One or more box level products may be used to create more complex systems according to the present invention.

Figure 11:
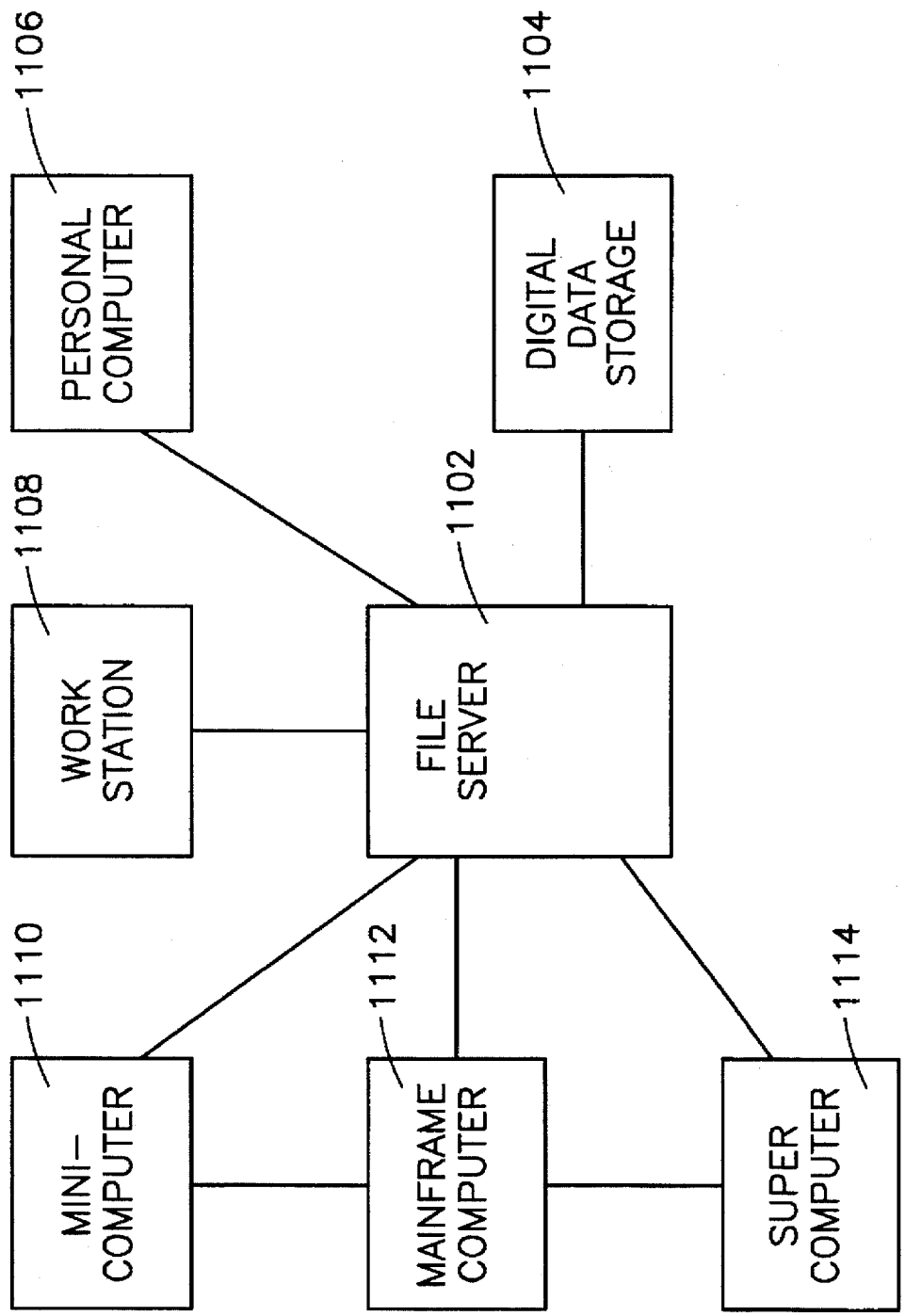
FIG. 11 a schematic block diagram of a computer system.

FIG. 11 illustrates a schematic block diagram of various computer systems interconnected together via various digital data transmission systems. A file server 1102 is connected to a digital data storage device 1104 such as, for example, magnetic hard disk, tape, optical disk, flash memory, core memory, semiconductor memory and the like. The server 1102 may be connected to at least one personal computer 1106, a work station 1108, a minicomputer 1110, a mainframe computer 1112, and a super computer 1114 through a number of digital data transmission system networks such as token ting, star, coaxial, fiber-optic and the like. These networks may utilize data protocols such as Scaleable Coherent Interface ("SCI"), ANSI/IEEE Std 1596–1992 SCI, Asynchronous Transfer Mode ("ATM"), FiberChannel, SerialBus, SCSI, SSA, QuickRing, HIPPI, FDDI, Ethernet and the like.

Figure 12:
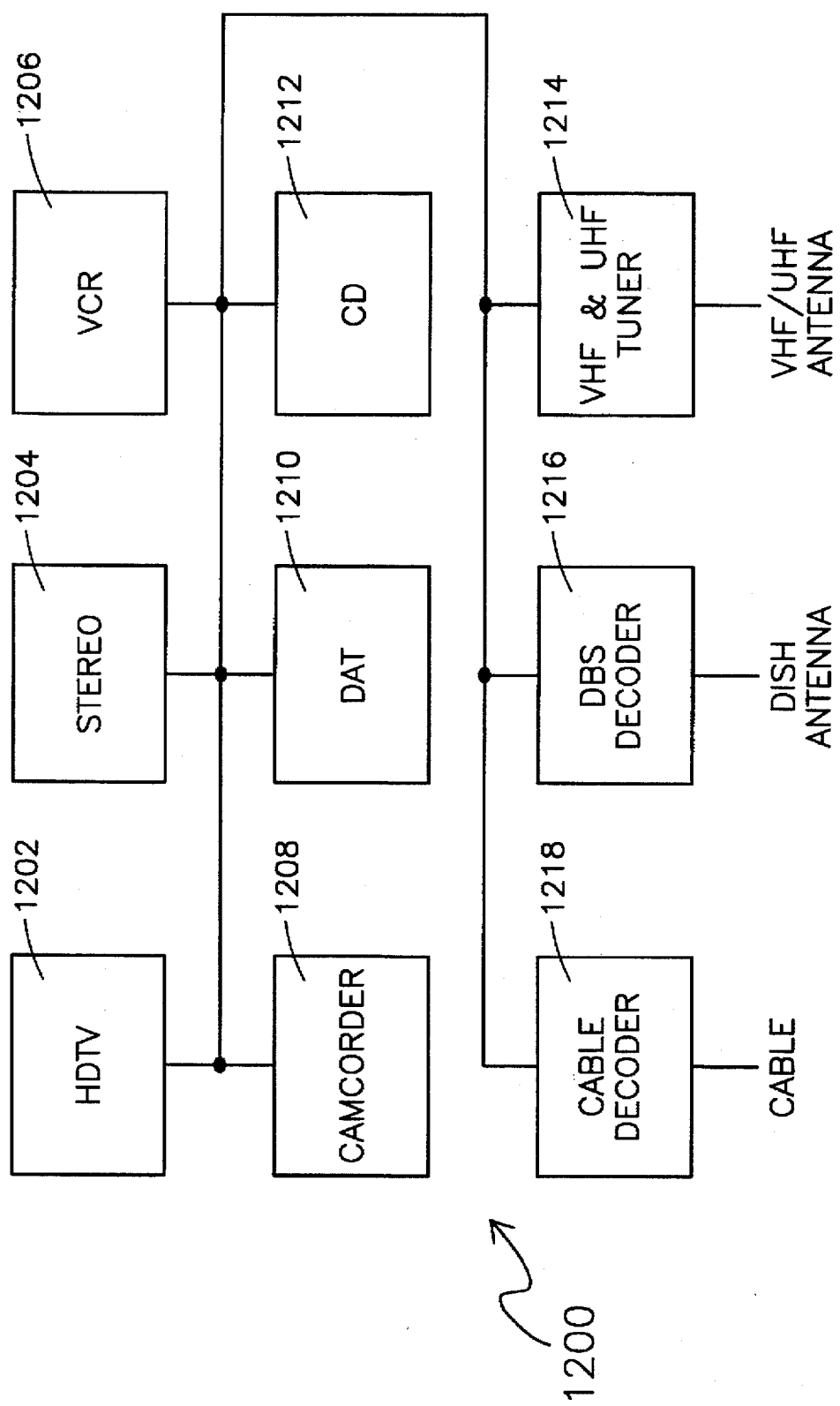
FIG. 12 a schematic block diagram of an entertainment system.

FIG. 12 is a schematic block diagram of an entertainment system according to the present invention. The entertainment system 1200 may be comprised of the following component subsystems: a high definition television (HDTV) 1202, a stereo 1204, a video cassette recorder (VCR) 1206, a television camera/recorder (Camcorder) 1208, a digital audio tape unit (DAT) 1210, a compact disk player (CD) 1212, a VHF/UHF tuner 1214, a direct broadcast satellite (DBS) decoder 1216, and a cable decoder 1218. These component subsystems are made up of SCM, MCM, BLP and boxes as disclosed above.

Figure 13:
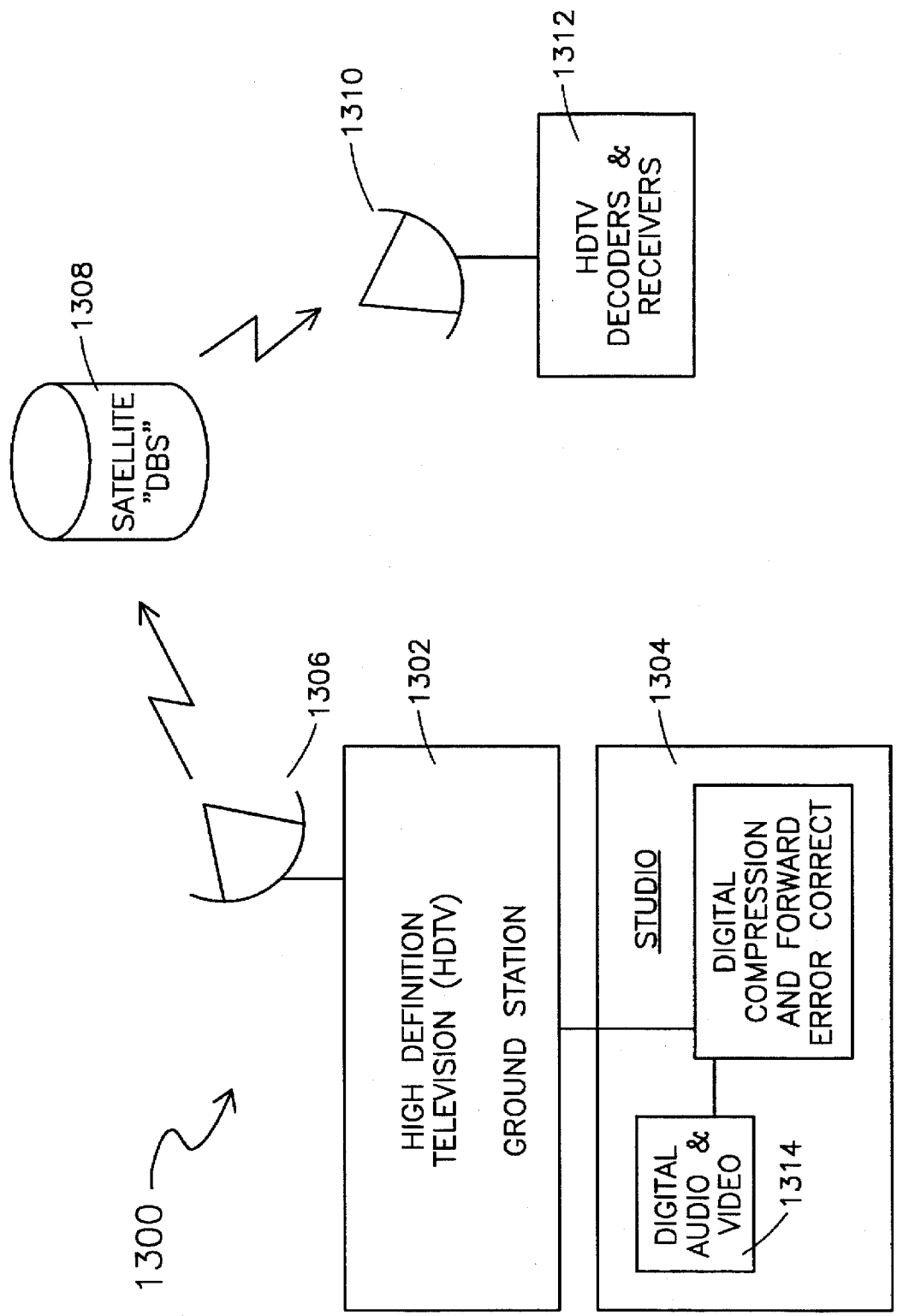
FIG. 13 is a schematic block diagram of an information and entertainment transmission system.

The DBS decoder 1216 receives a digitally encoded and forward error corrected signal from a dish antenna (not illustrated) which receives a DBS entertainment signal from a geosynchronous satellite (see FIG. 13). Hardwired cable is connected to the cable decoder 1218 which decodes and converts the cable entertainment channels to signals for viewing on the HDTV 1202 or a standard television (not illustrated). Standard broadcast television and stereo signals may be received by the VHF/UHF tuner 1214 and the base band signals made available to the HDTV 1202, stereo 1204 and the other recording devices (VCR 1206, DAT 1210). Similarly, recorded entertainment information may be played on the HDTV 1202 and stereo 1204 from the playback devices (DAT 1210, Camcorder 1208, CD 1212, VCR 1206) for viewing and listening enjoyment by the user.

FIG. 13 is a schematic block diagram of an information and entertainment communications system according to the present invention. The information and entertainment communications system 1300 is comprised of the following systems: A HDTV ground station 1302 which transmits a digitally encoded and forward error corrected signal from the HDTV studio 1304 by microwave dish 1306 to a DBS satellite 1308. The satellite 1308 rebroadcasts the signal from the studio 1304 to a plurality of ground station dish antennas 13 10 which are connected to corresponding HDTV receivers/decoders 13 12 where the DBS satellite signal is processed and made available, for example, to the entertainment system 1200. The system 1300 is comprised of many SCM, MCM, BLP and box level subsystems which greatly benefit from the features, aspects and advantages of the present invention. Some of these subsystems are a digital audio and video formatting subsystem 1314 which convert the analog entertainment information into a digital format, and a digital compression and forward error connection subsystem 1316 which prepares the digitally encoded entertainment information for transmission by the ground station 1302 to the satellite 1308.

Figure 14:
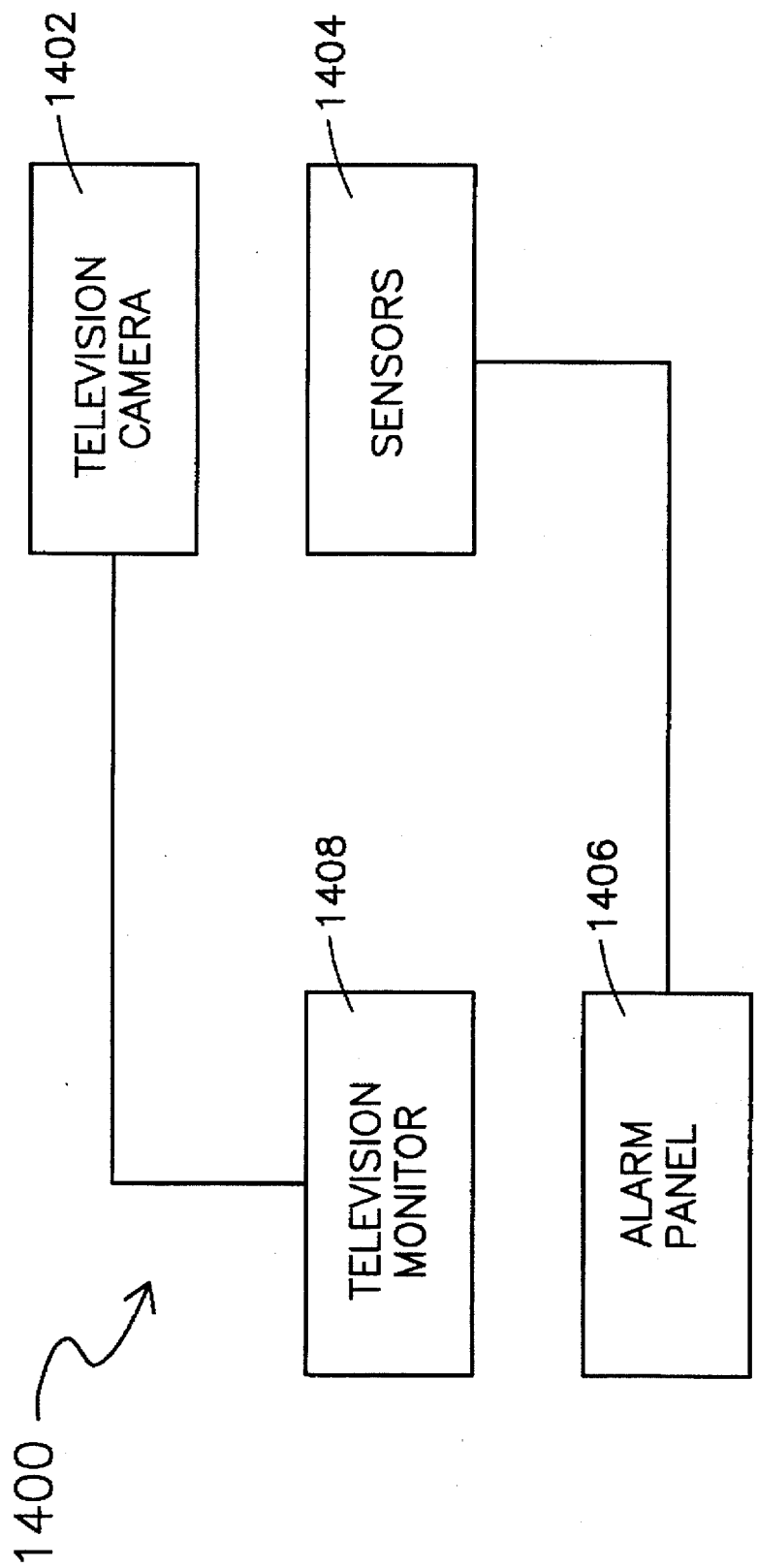
FIG. 14 is a schematic block diagram of a security and surveillance system.

FIG. 14 is a schematic block diagram of a security and surveillance system according to the present invention. The security and surveillance system 1400 is comprised of the following subsystems: A television camera 1402, intrusion detection sensors 1404, a sensor alarm panel 1406, and a television monitor 1408. The television monitor 1408 displays what the television camera(s) 1402 observe. The alarm panel 1406 displays the status of the sensors 1404 and will annunciate an alert upon a sensed alarm condition. The system 1400 may be utilized in homes, businesses, government building, military bases, prisons and any area requiring security and surveillance.

Figure 16:
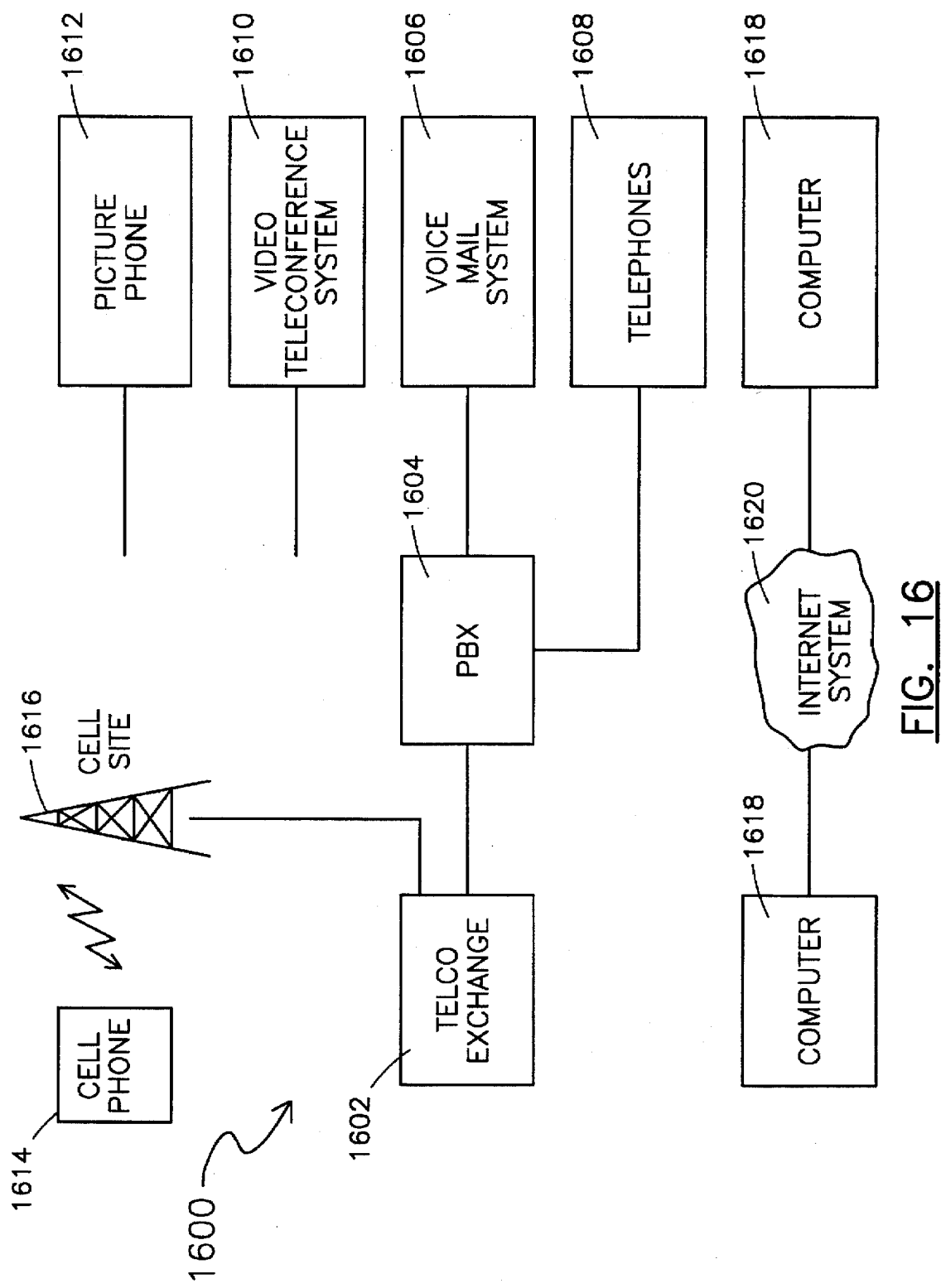
FIG. 16 is a schematic block diagram of a plurality of communications and information transmission systems.

In addition, another embodiment of the security and surveillance system 1400 may be utilized to monitor operating conditions of transportation systems such as engine status, .hull integrity, operating temperatures, maintenance evaluation and other parameters deemed necessary for the safe and efficient operation of the transportation systems (see FIG. 16). In a further embodiment of subsystems for the transportation systems, positioning and navigational (GPS) systems may be utilized for hazard avoidance, as well as radar and sonar (see FIG. 16). Further, operation of the transportation systems may be implemented by digital control, such as "fly-by-wire," along with the monitoring thereof. The system 1400 and its subsystems may be utilized with the other system embodiments disclosed herein and will greatly benefit from the features, aspects and advantages of invention as disclosed hereinabove.

Figure 15:
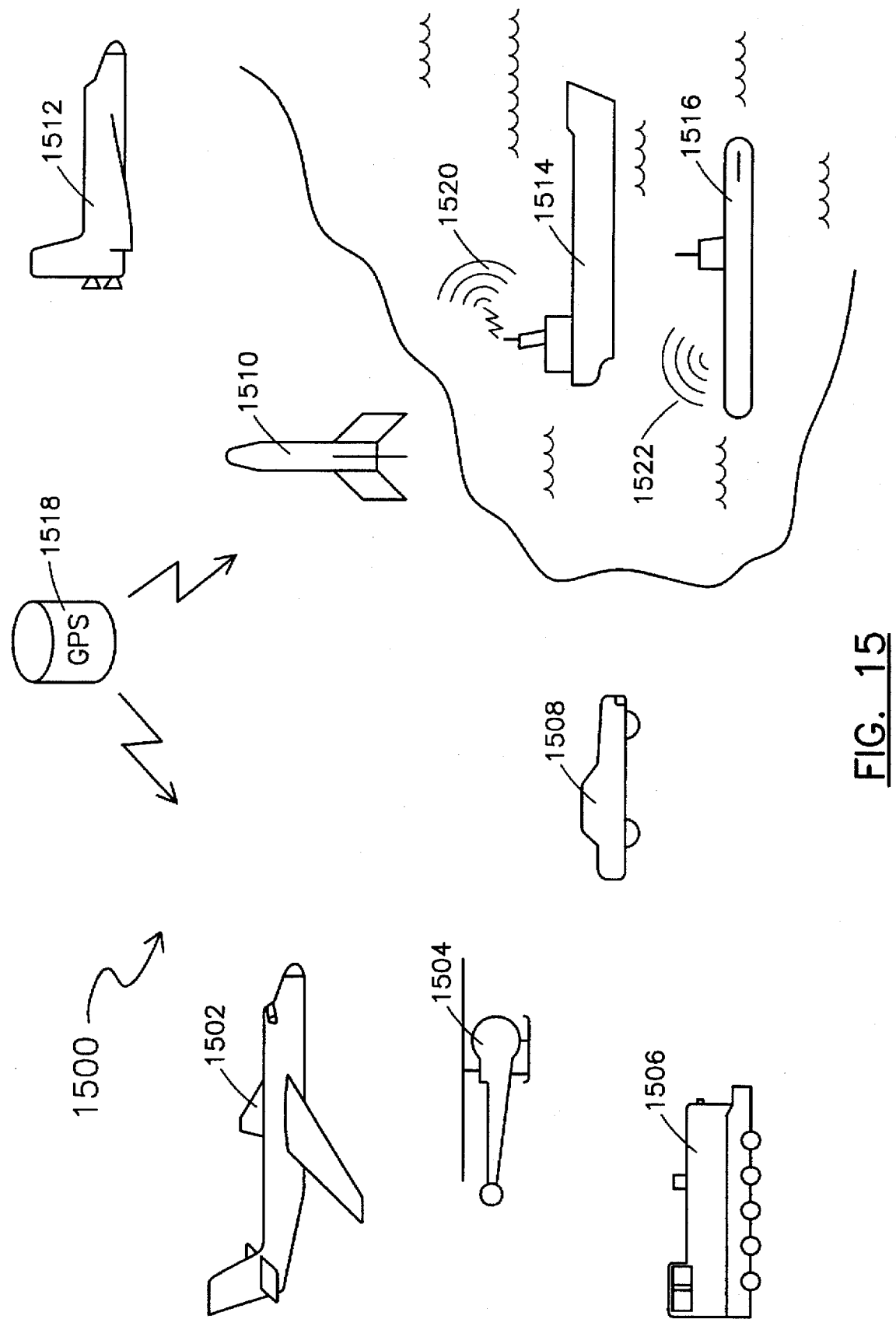
FIG. 15 is a schematic block diagram of a plurality of transportation systems.

FIG. 15 is a schematic block diagram of a plurality of transportation systems according to the present invention. The transportation systems, generally referenced to by the numeral 1500, may utilize, individually or in combination, the aforementioned systems to great advantage. Embodiments of the transportation system 1500 is as follows: An airplane 1502, a helicopter 1504, a train 1506, a vehicle 1508 such as an automobile or truck, a rocket 1510, a space shuttle 1512, a ship 1514, a submarine 1516, and the like. Each of the embodiments of the transportation systems 1500 contemplated herein may greatly benefit from the communications, navigation and control systems disclosed herein along with he features, aspects and advantages of the present invention.

Each of the embodiments of the transportation systems 1500 may utilize a positioning and navigation system which derives its position information from a global positioning satellite system (GPS) 1518. The positioning and navigation system is comprised of SCM, MCM, BLP and box level systems as discussed hereinabove. Radar 1520 and/or sonar 1522 systems may be utilized for collusion avoidance and location and may be incorporated with any of the transportation systems 1500.

FIG. 16 is a schematic block diagram of a plurality of communications and information transmission systems according to the present invention. The communications and information transmission systems 1600 may comprise, individually or in combination, a telephone exchange 1602, a PBX 1604, a voice mail system 1606, telephones 1608, a video teleconferencing system 1610, a video picture telephone 1612 and the like. The systems 1600 may also comprise a cellular telephone 1614, and a plurality of cell sites 1616 which may be connected with the telephone system 1602. Further, systems 1600 may be computers 1618 connected together through the internet system 1620. Both analog and digital communications are contemplated herein with the various features, advantages and aspects of the present invention.

Other MCM, SCM, mini-board, micro-board, board level and other system sub-assemblies are contemplated using the input and/or output drive reduction circuits of the present invention. Additionally, such sub-assemblies or packages using such drive reduction circuits may be used in traditional circuit boards or sub-assemblies for a system level product. Examples of electronic systems that may benefit from the system and method of the present invention have been mentioned above. The spirit and intent of the present invention is to improve the speed and reduce the power consumption of all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to a particularly preferred embodiment of the invention, such reference does not imply a limitation on the invention, and no such limitation is to be inferred. The invention is capable of considerable modification, alternation, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the sprit and scope of the appended claims, giving full cognizance to equivalents in all respects.

What is claimed is:

1. An electronic system having at least one integrated circuit, comprising:

at least one integrated circuit comprised of a plurality of transistors on a semiconductor substrate, said semiconductor substrate having a plurality of input and output connection pads, wherein said input connection pads are connected to input circuits of some of the plurality of transistors and said output connection pads are connected to output circuits of some of the plurality of transistors; and a plurality of planar conductive structures located between respective said connection pads and the semiconductor substrate, wherein each of said plurality of planar conductive structures is connected to some other of the plurality of transistors such that the voltage potential on each of said planar conductive structures substantially tracks the voltage potential on each of the respective said connection pads.

2. The system of claim 1, wherein said connection pads are metal.

3. The system of claim 2, wherein said metal connection pads are from about 60 to 100 micrometers on a side.

4. The system of claim 2, wherein said metal connection pads are adapted for connection to bond wires.

5. The system of claim 4, wherein said metal connection pads are connected to the bond wires by tape automated bonding.

6. The system of claim 4, wherein said metal connection pads are connected to the bond wires by thermal compression bonding.

7. The system of claim 1, wherein said plurality of planar conductive structures are made of metal.

8. The system of claim 1, wherein said plurality of planar conductive structures are made of polysilicon.

9. The system of claim 1, wherein said plurality of planar conductive structures are made of silicide over polysilicon.

10. The system of claim 1, wherein said planar conductive structures are from about 60 to 100 micrometers on a side.

11. The system of claim 1, wherein each of said plurality of planar conductive structures is substantially the same size and shape as the respective said plurality of connection pads and are substantially aligned therewith.

12. The system of claim 1, wherein some of the plurality of transistors are negative channel metal oxide semiconductor (NMOS) and some other of the transistors are positive channel metal oxide semiconductor (PMOS), both NMOS and PMOS transistors connected as complementary metal oxide semiconductor (CMOS) amplifiers.

13. The system of claim 12, wherein some of the CMOS amplifier inputs are connected to said input connection pads, some of the CMOS amplifier outputs are connected to said output connection pads, and some other of the CMOS amplifier outputs are connected to said planar conductive structures.

14. An electronic system having at least one integrated circuit comprised of a plurality of transistors on a semiconductor substrate, said system comprising:

- at least one integrated circuit on a semiconductor substrate, said semiconductor substrate and a plurality of transistors therein;
- a first insulating layer over said semiconductor substrate;
- a plurality of planar conductive structures over said first insulating layer;
- a second insulating layer over said plurality of planar conductive structures; and
- a plurality of input and output connection pads positioned over respective ones of said plurality of planar conductive structures;

wherein said input connection pads are connected to input circuits of some of the plurality of transistors, said output connection pads are connected to output circuits of some of the plurality of transistors, and each of said plurality of planar conductive structures is connected to output circuits of some other of the plurality of transistors such that the voltage potential on each of said planar conductive structures substantially tracks the voltage potential on each of the respective said connection pads.

15. The system of claim 1, wherein the electronic system is a single chip module.

16. The system of claim 1, wherein the electronic system is a multi-chip module having at least one semiconductor device.

17. The system of claim 1, wherein the electronic system is a board level product having a plurality of semiconductor devices on at least one printed wiring board.

18. The system of claim 1, wherein the electronic system is a box level system having a plurality of semiconductor devices on at least one printed wiring board mounted into a box with a power source.

19. The system of claim 1, wherein the electronic system is a computer system.

20. The system of claim 1, wherein the electronic system is an information and entertainment transmission system.

21. The system of claim 1, wherein the electronic system is an entertainment system.

22. The system of claim 1, wherein the electronic system is a security and surveillance system.

23. The system of claim 1, wherein the electronic system is an information, data acquisition and control system.

24. The system of claim 1, wherein the electronic system is utilized in a transportation system.

* * * * *